United States Patent
Itagaki

(10) Patent No.: US 9,490,019 B2
(45) Date of Patent: Nov. 8, 2016

(54) NONVOLATILE SEMICONDUCTOR MEMORY DEVICE AND DATA ERASE METHOD THEREOF

(71) Applicant: KABUSHIKI KAISHA TOSHIBA, Minato-ku (JP)

(72) Inventor: Kiyotaro Itagaki, Naka-gun (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/694,432

(22) Filed: Apr. 23, 2015

(65) Prior Publication Data

US 2015/0228347 A1  Aug. 13, 2015

Related U.S. Application Data

(63) Continuation of application No. 13/483,610, filed on May 30, 2012, now Pat. No. 9,036,411.

(30) Foreign Application Priority Data

Jun. 2, 2011 (JP) .................. 2011-124127

(51) Int. Cl.
  G11C 11/34     (2006.01)
  G11C 16/14     (2006.01)
  G11C 16/04     (2006.01)
  G11C 16/08     (2006.01)
  G11C 16/32     (2006.01)

(52) U.S. Cl.
  CPC .......... *G11C 16/14* (2013.01); *G11C 16/0483* (2013.01); *G11C 16/08* (2013.01); *G11C 16/32* (2013.01)

(58) Field of Classification Search
  CPC .......... G11C 16/3418; G11C 16/0483; G11C 16/10; G11C 16/0433; H01L 27/115; H01L 27/11521; H01L 29/7883
  USPC ............ 365/185.02, 185.05, 185.06, 185.11, 365/185.17, 185.18, 185.119, 185.23, 365/185.29
  See application file for complete search history.

(56) References Cited

U.S. PATENT DOCUMENTS

| 7,095,657 B2 | 8/2006 | Takase et al. |
| 7,548,457 B2 | 6/2009 | Kang et al. |
| 7,558,118 B2 | 7/2009 | Futatsuyama |
| 7,936,004 B2 | 5/2011 | Kito et al. |

(Continued)

FOREIGN PATENT DOCUMENTS

| JP | 2007-250186 | 9/2007 |
| JP | 2007-266143 | 10/2007 |

(Continued)

*Primary Examiner* — Fernando Hidalgo
(74) *Attorney, Agent, or Firm* — Oblon, McClelland, Maier & Neustadt, L.L.P

(57) ABSTRACT

A nonvolatile semiconductor memory device according to an aspect includes a semiconductor substrate, a memory cell array, memory strings, drain side selection transistors, source side selection transistors, word lines, bit lines, a source line, a drain side selection gate line, a source side selection gate line, and a control circuit. The control circuit applies a first voltage to a selected bit line, thereby executing an erase operation on a selected memory string connected to the selected bit line, and the control circuit applies a second voltage to a non-selected bit line, thereby prohibiting the erase operation for the selected memory string connected to the non-selected bit line. The first voltage is more than the second voltage.

8 Claims, 14 Drawing Sheets

(56) References Cited

U.S. PATENT DOCUMENTS

| | | |
|---|---|---|
| 8,174,890 B2 | 5/2012 | Maeda et al. |
| 8,189,391 B2 | 5/2012 | Itagaki et al. |
| 2007/0047309 A1* | 3/2007 | Satoh ............... G11C 16/0466 365/185.17 |
| 2008/0019185 A1 | 1/2008 | Li |
| 2010/0072539 A1 | 3/2010 | Yasuda |
| 2010/0207195 A1 | 8/2010 | Fukuzumi et al. |
| 2010/0214838 A1* | 8/2010 | Hishida ................. G11C 8/08 365/185.11 |
| 2011/0038703 A1 | 2/2011 | Dickerson et al. |
| 2011/0188302 A1* | 8/2011 | Lee ........................ G11C 11/00 365/163 |
| 2011/0266611 A1 | 11/2011 | Kim et al. |
| 2011/0287597 A1 | 11/2011 | Kito et al. |
| 2012/0008415 A1 | 1/2012 | Park |
| 2012/0069663 A1 | 3/2012 | Itagaki et al. |
| 2012/0216094 A1* | 8/2012 | Yoo .................... G06F 11/1068 714/758 |
| 2013/0329500 A1 | 12/2013 | Han et al. |

FOREIGN PATENT DOCUMENTS

| | | |
|---|---|---|
| JP | 2008-108317 | 5/2008 |
| JP | 2009-146954 | 7/2009 |
| JP | 2010-74096 | 4/2010 |
| JP | 2012-69205 A | 4/2012 |

* cited by examiner

NONVOLATILE SEMICONDUCTOR MEMORY DEVICE AND DATA ERASE METHOD THEREOF

CROSS-REFERENCE TO RELATED APPLICATIONS

This continuation application is based upon and claims the benefit of priority under 35 USC §120 from U.S. Ser. No. 13/483,610, filed May 30, 2012, which claims the benefit from prior Japanese Patent Application No. 2011-124127, filed on Jun. 2, 2011, the entire contents of each of which are incorporated herein by reference.

FIELD

Embodiments described in this specification relate to an electrically data-rewritable nonvolatile semiconductor memory device and a data erase method thereof.

BACKGROUND

In order to improve bit density of a nonvolatile semiconductor memory device such as a NAND-type flash memory, memory cells are expected to be provided in multiple layers. As one of such examples, a stacked NAND-type flash memory in which a memory transistor is made using a vertical transistor has been proposed.

BRIEF DESCRIPTION OF THE DRAWINGS

FIG. 4 is a top view illustrating a word line conductive layer 41a.

DETAILED DESCRIPTION

A nonvolatile semiconductor memory device according to an aspect includes a semiconductor substrate, a memory cell array, a plurality of memory strings, a plurality of drain side selection transistor, a plurality of source side selection transistor, a plurality of word lines, a plurality of bit lines, a source line, a drain side selection gate line, a source side selection gate line, and a control circuit. The memory cell array includes the plurality of memory strings. The plurality of memory strings has a plurality of electrically rewritable memory transistors connected in series and stacked above the semiconductor substrate. One end of the drain side selection transistor is connected to a first end of a memory string. One end of the source side selection transistor is connected to a second end of the memory string. The plurality of word lines are arranged to be commonly connected to the plurality of memory strings. The plurality of bit lines are respectively connected to the other ends of the drain side selection transistors. The source line is commonly connected the gates of the drain side selection transistors. The source side selection gate line is commonly connected the gates of the source side selection transistors. The control circuit is configured to control a voltage applied to the memory cell array. The control circuit is configured to apply a first voltage to a selected bit line, thereby executing an erase operation on a selected memory string connected to the selected bit line, and the control circuit is configured to apply a second voltage to a non-selected bit line, thereby prohibiting the erase operation for the selected memory string connected to the non-selected bit line. The first voltage is more than the second voltage.

Embodiments of nonvolatile semiconductor memory devices will be hereinafter explained with reference to drawings.

First Embodiment

Overall Configuration

Figure 1:
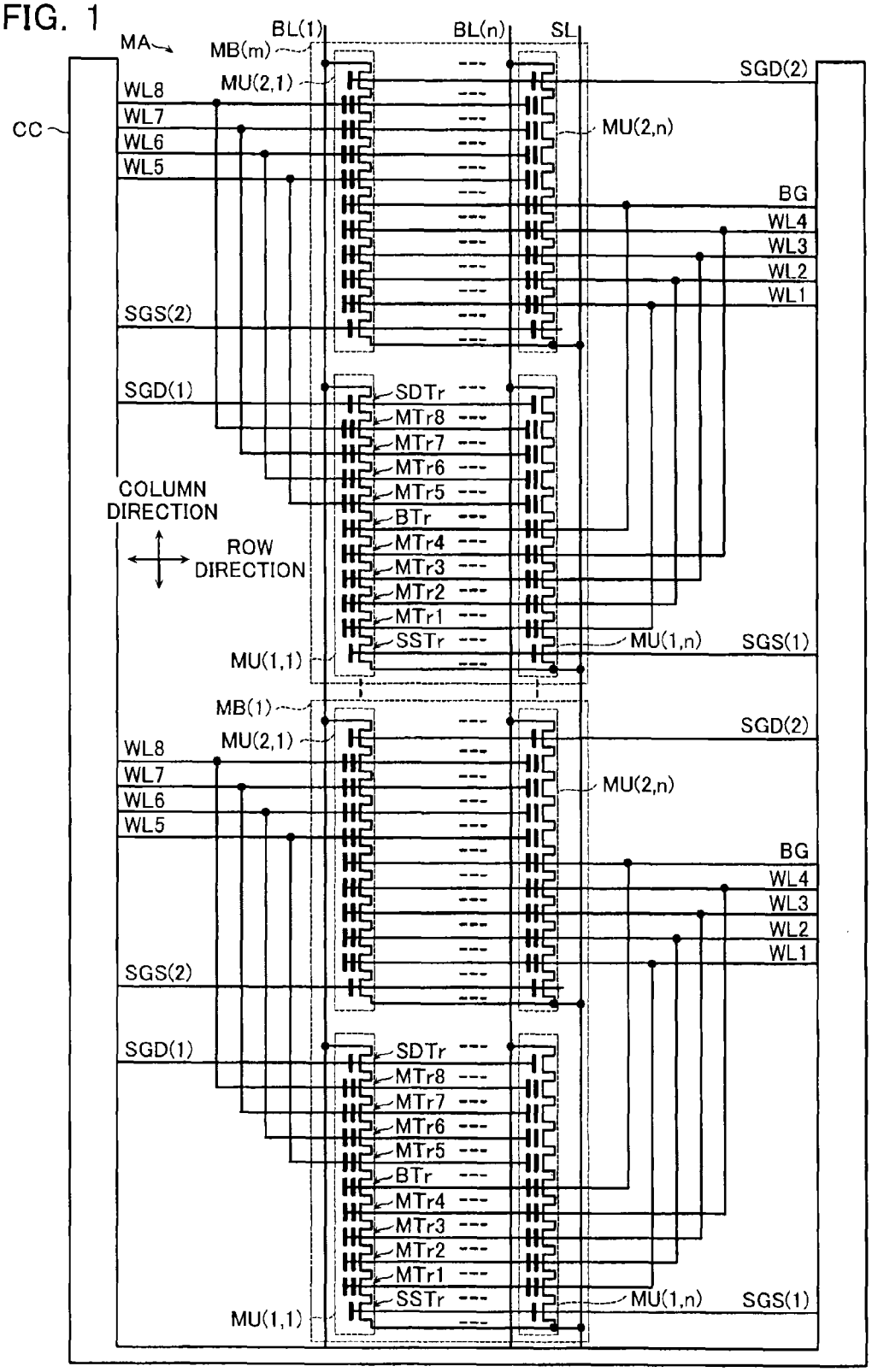
FIG. 1 is a figure illustrating a memory cell array MA and a peripheral circuit CC of a nonvolatile semiconductor memory device according to a first embodiment.

First, overall configuration of a nonvolatile semiconductor memory device according to a first embodiment will be explained with reference to FIG. 1. The nonvolatile semiconductor memory device according to the first embodiment includes a memory cell array MA and a peripheral circuit CC as shown in FIG. 1. A specific configuration of the peripheral circuit CC will be explained in detail with reference to FIG. 7 later.

As shown in FIG. 1, the memory cell array MA includes m memory blocks MB(1), . . . MB(m). In the explanation below, when all the memory blocks ML(1) . . . (m) are collectively referred to, all the memory blocks ML(1) . . . (m) may be denoted as a memory block MB.

Bit lines BL are formed to extend in a column direction over a plurality of memory blocks MB with a predetermined pitch in a row direction.

Each memory block MB includes memory units MU(1, 1) to MU(2, n) arranged in a matrix form having n rows by 2 columns. The matrix form having n rows by 2 columns is merely an example, and the embodiment is not limited thereto. The memory unit MU includes a memory string MS, a source side selection transistor SSTr, and a drain side selection transistor SDTr. In the explanation below, the memory units MU(1,1) to (2, *n*) may not be distinguished from each other and may be simply denoted as memory units MU. One end of the memory unit MU is connected to the bit line BL, and the other end of the memory unit MU is connected to a source line SL.

As shown in FIG. 1, the memory string MS includes memory transistors MTr1 to MTr8 (memory cell) and a back gate transistor BTr connected in series. The memory transistors MTr1 to MTr4, MTr5 to MTr8 are respectively connected in series. The back gate transistor BTr is connected between the memory transistor MTr4 and the memory transistor MTr5.

The memory transistors MTr1 to MTr8 store data by accumulating charges in charge accumulation layers therein. The memory transistor MTr1 may be used as a dummy transistor DTr which is not used for storing data. The back gate transistor BTr is in conductive state when at least the memory string MS is selected as a target of operation.

In the memory blocks MB(1) to MB(m), word lines WL1 to WL8 are commonly connected to the respective gates of the memory transistors MTr1 to MTr8 arranged in a matrix form having n rows by 2 columns. A back gate line BG is commonly connected to the respective gates of the back gate transistors BTr in n rows by 2 columns.

A drain of the source side selection transistor SSTr is connected to a source of the memory string MS. A source of the source side selection transistor SSTr is connected to the source line SL. One source side selection gate line SGS(1) or SGS(2) is commonly connected to the gates of the n source side selection transistors SSTr arranged in a line in the row direction in each memory block MB. In the explanation below, the source side selection gate lines SGS(1), (2) may not be distinguished from each other and may be collectively denoted as source side selection gate lines SGS.

A source of the drain side selection transistor SDTr is connected to a drain of the memory string MS. A drain of the drain side selection transistor SDTr is connected to the bit line BL. One drain side selection gate line SGD(1) or SGD(2) is commonly connected to the gates of the n drain side selection transistors SDTr arranged in a line in the row direction in each memory block MB. In the explanation below, the drain side selection gate line SGD(1), (2) may not be distinguished from each other and may be collectively denoted as drain side selection gate lines SGD.

[Stacked Structure]

Figure 2:
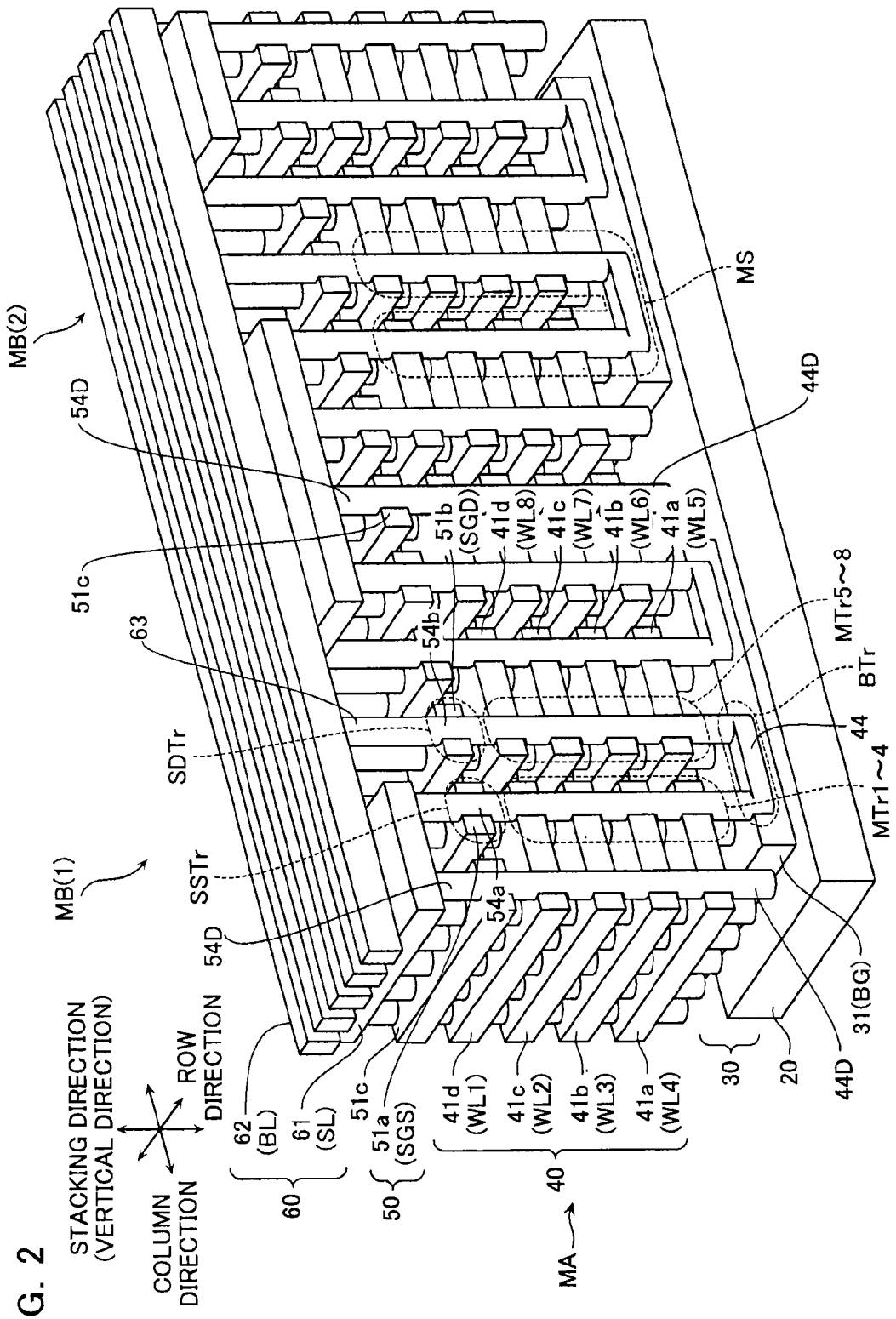
FIG. 2 is a perspective view illustrating a stacked structure of the memory cell array MA according to the first embodiment.
Figure 3:
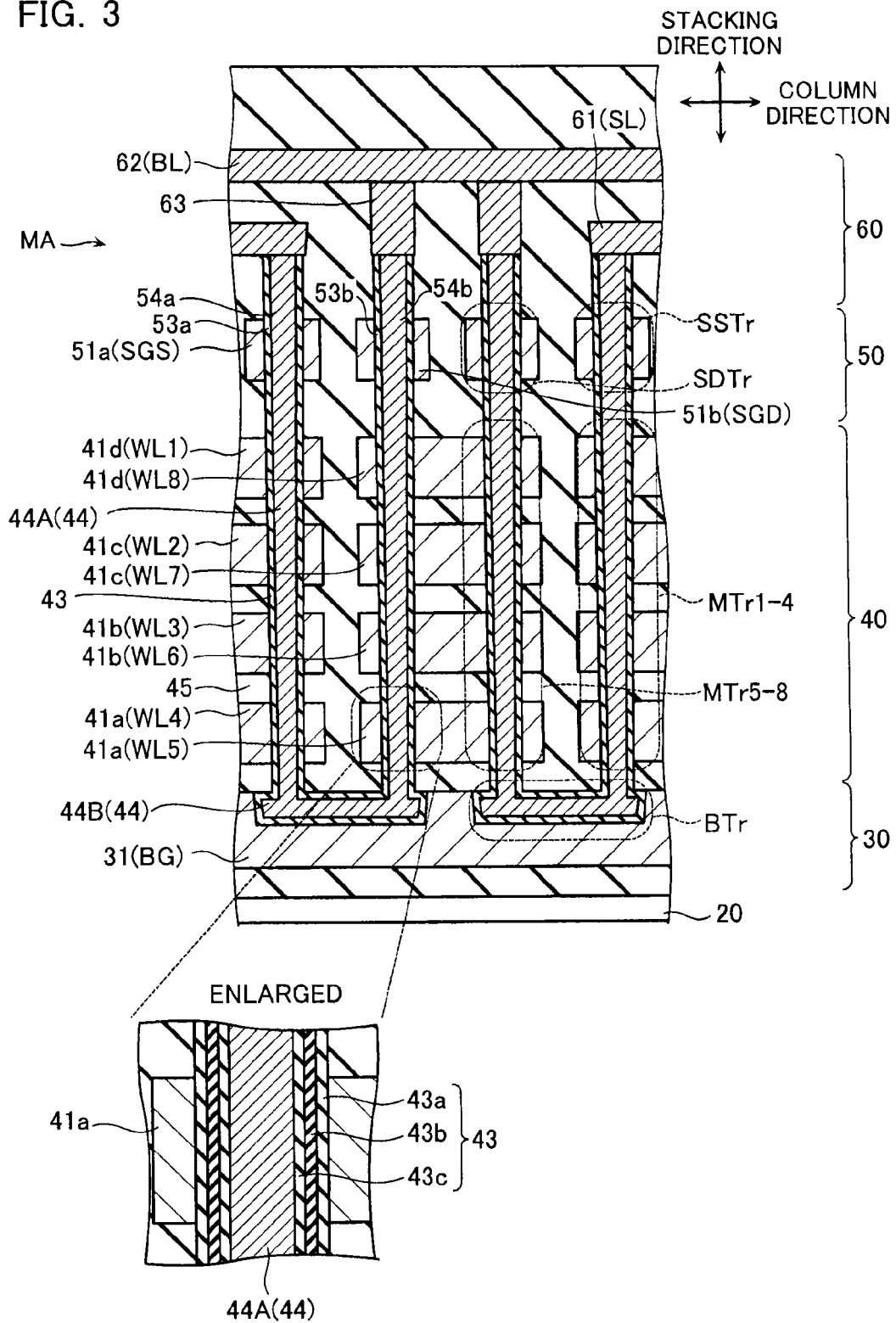
FIG. 3 is a cross sectional view illustrating a stacked structure of the memory cell array MA according to the first embodiment.

As shown in FIGS. 2 and 3, one memory block MB includes a back gate layer 30, a memory layer 40, a selection transistor layer 50, and a wiring layer 60, which are stacked in order on a semiconductor substrate 20. The back gate layer 30 functions as the back gate transistor BTr. The memory layer 40 functions as the memory transistors MTr1 to MTr8. The selection transistor layer 50 functions as the drain side selection transistor SDTr and the source side selection transistor SSTr. The wiring layer 60 functions as the source line SL and the bit line BL.

As shown in FIGS. 2 and 3, the back gate layer 30 has a back gate conductive layer 31. The back gate conductive layer 31 functions as the back gate line BG and the gate of the back gate transistor BTr. The back gate conductive layer 31 is formed to extend in a plate-like manner in two dimensions, i.e., a row direction and a column direction parallel to the semiconductor substrate 20. For example, the back gate conductive layer 31 is made of polysilicon (poly-Si).

As shown in FIG. 3, the back gate layer 30 includes a memory gate insulating layer 43 and a joining semiconductor layer 44B. The memory gate insulating layer 43 is provided between the joining semiconductor layer 44B and the back gate conductive layer 31. The joining semiconductor layer 44B functions as a body (channel) of the back gate transistor BTr. The joining semiconductor layer 44B is formed to engrave the back gate conductive layer 31. The joining semiconductor layer 44B is formed in a generally rectangular form of which longitudinal direction is the column direction when seen from the above. The joining semiconductor layer 44B is formed in a matrix form in the row direction and the column direction in one memory block MB. For example, the joining semiconductor layer 44B is made of polysilicon (poly-Si).

As shown in FIGS. 2 and 3, the memory layer 40 is formed in an upper layer of the back gate layer 30. The memory layer 40 includes four word line conductive layers 41*a* to 41*d*. The word line conductive layer 41*a* functions as the word line WL4 and the gate of the memory transistor MTr4. The word line conductive layer 41*a* also functions as the word line WL5 and the gate of the memory transistor MTr5. Likewise, the word line conductive layers 41*b* to 41*d* respectively function as the word lines WL1 to WL3 and the gates of the memory transistors MTr1 to MTr3. The word line conductive layers 41*b* to, 41*d* respectively function as the word lines WL6 to WL8 and the gates of the memory transistors MTr6 to MTr8.

The word line conductive layers 41*a* to 41*d* are stacked with inter-layer insulating layers 45 interposed therebetween in the vertical direction. The word line conductive layers 41*a* to 41*d* are formed with a pitch in the column direction to extend with the row direction (direction perpendicular to the sheet surface of FIG. 3) being the longitudinal direction. For example, the word line conductive layers 41*a* to 41*d* are made of polysilicon (poly-Si).

As shown in FIG. 3, the memory layer 40 includes a memory gate insulating layer 43, columnar semiconductor layer 44A, and a dummy semiconductor layer 44D. The memory gate insulating layer 43 is provided between the columnar semiconductor layer 44A and the word line conductive layers 41*a* to 41*d*. The columnar semiconductor layer 44A functions as bodies (channels) of the memory transistors MTr1 to MTr8. The dummy semiconductor layer 44D does not function as the bodies of the memory transistors MTr1 to MTr8.

The memory gate insulating layer 43 includes a block insulating layer 43*a*, a charge accumulation layer 43*b*, and a tunnel insulating layer 43*c*, which are arranged from a side surface sides of the word line conductive layers 41*a* to 41*d* to a side of the memory columnar semiconductor layer 44. The charge accumulation layer 43*b* is configured to be able to accumulate charges.

The block insulating layer 43*a* is formed with a predetermined thickness on the side surfaces of the word line conductive layers 41*a* to 41*d*. The charge accumulation layer 43*b* is formed with a predetermined thickness on a side surface of the block insulating layer 43*a*. The tunnel insulating layer 43*c* is formed with a predetermined thickness on a side surface of the charge accumulation layer 43*b*. The block insulating layer 43*a* and the tunnel insulating layer 43*c* are made of silicon oxide ($SiO_2$). The charge accumulation layer 43*b* is made of silicon nitride (SiN).

The columnar semiconductor layer 44A is formed to penetrate through the word line conductive layers 41*a* to 41*d* and the inter-layer insulating layer 45. The columnar semiconductor layer 44A extends in a direction perpendicular to the semiconductor substrate 20. The pair of columnar semiconductor layers 44A is formed to be in consistent with a portion close to an end portion of the joining semiconductor layer 44B in the column direction. For example, the columnar semiconductor layer 44A is made of polysilicon (poly-Si). The dummy semiconductor layer 44D is formed to penetrate through the word line conductive layers 41a to 41d and the inter-layer insulating layer 45. Below the dummy semiconductor layer 44D, the back gate conductive layer 31 is not provided.

In the back gate layer 30 and the memory layer 40, the pair of columnar semiconductor layers 44A and the joining semiconductor layer 44B joined with the lower ends thereof constitute the memory semiconductor layer 44 functioning as a body (channel) of the memory string MS. The memory semiconductor layer 44 is formed in a U shape when seen in the row direction.

In other words, the configuration of the back gate layer 30 is such that the back gate conductive layer 31 surrounds a side surfaces and a lower surface of the joining semiconductor layer 44B with the memory gate insulating layer 43 interposed therebetween. In other words, the configuration of the memory layer 40 is such that the word line conductive layers 41a to 41d are formed to surround the side surfaces of the columnar semiconductor layer 44A with the memory gate insulating layer 43 interposed therebetween.

As shown in FIGS. 2 and 3, the selection transistor layer 50 includes the source side conductive layer 51a, a drain side conductive layer 51b, and a dummy conductive layer 51c. The source side conductive layer 51a functions as the source side selection gate line SGS and the gate of the source side selection transistor SSTr. The drain side conductive layer 51b functions as the drain side selection gate line SGD and the gate of the drain side selection transistor SDTr. The dummy conductive layer 51c does not function as the source side selection gate line SGS and the drain side selection gate line SGD.

The source side conductive layer 51a is formed in an upper layer of one of the columnar semiconductor layers 44A constituting the memory semiconductor layer 44. The drain side conductive layer 51b is in the same layer as the source side conductive layer 51a, and is formed in an upper layer of the other of the columnar semiconductor layers 44A constituting the memory semiconductor layer 44. The dummy conductive layer 51c is in the same layer as the source side conductive layer 51a, and is arranged in a portion other than the upper layer of the columnar semiconductor layer 44A. The plurality of source side conductive layers 51a, drain side conductive layers 51b, and dummy conductive layers 51c are formed to extend in the row direction with a predetermined pitch in the column direction. For example, the source side conductive layer 51a and the drain side conductive layer 51b are made of polysilicon (poly-Si).

As shown in FIG. 3, the selection transistor layer includes a source side gate insulating layer 53a, a source side columnar semiconductor layer 54a, a drain side gate insulating layer 53b, a drain side columnar semiconductor layer 54b, and a dummy semiconductor layer 54D. The source side columnar semiconductor layer 54a functions as a body (channel) of the source side selection transistor SSTr. The drain side columnar semiconductor layer 54b functions as a body (channel) of the drain side selection transistor SDTr.

The source side gate insulating layer 53a is provided between the source side conductive layer 51a and the source side columnar semiconductor layer 54a. The source side columnar semiconductor layer 54a is formed to penetrate through the source side conductive layer 51a. The source side columnar semiconductor layer 54a is connected to a side surface of the source side gate insulating layer 53a and an upper surface of one of the pair of columnar semiconductor layers 44A, and is formed in a pillar shape extending in a direction perpendicular to the semiconductor substrate 20. For example, the source side columnar semiconductor layer 54a is made of polysilicon (poly-Si).

The drain side gate insulating layer 53b is provided between the drain side conductive layer 51b and the drain side columnar semiconductor layer 54b. The drain side columnar semiconductor layer 54b is formed to penetrate through the drain side conductive layer 51b. The drain side columnar semiconductor layer 54b is connected to a side surface of the drain side gate insulating layer 53b and an upper surface of the other of the pair of columnar semiconductor layers 44A, and is formed in a pillar shape extending in a direction perpendicular to the semiconductor substrate 20. For example, the drain side columnar semiconductor layer 54b is made of polysilicon (poly-Si).

The dummy semiconductor layer 54D is formed to penetrate through the dummy conductive layer 51c. The dummy semiconductor layer 54D is formed in an I shape. A lower surface of the dummy semiconductor layer 54D is in contact with an upper surface of the dummy semiconductor layer 44D.

The wiring layer 60 includes a source line layer 61, a bit line layer 62, and a plug layer 63. The source line layer 61 functions as the source line SL. The bit line layer 62 functions as the bit line BL.

The source line layer 61 is in contact with an upper surface of the source side columnar semiconductor layer 54a and is formed to extend in the row direction. The bit line layer 62 is in contact with an upper surface of the drain side columnar semiconductor layer 54b via the plug layer 63, and is formed to extend in the column direction. For example, the source line layer 61, the bit line layer 62, and the plug layer 63 are made of metallic materials such as tungsten.

Subsequently, the form of the word line conductive layer 41a will be explained in detail with reference to FIG. 4. The word line conductive layers 41b to 41d have the same shapes as the word line conductive layer 41a, and description thereabout is not repeated here.

Figure 4:
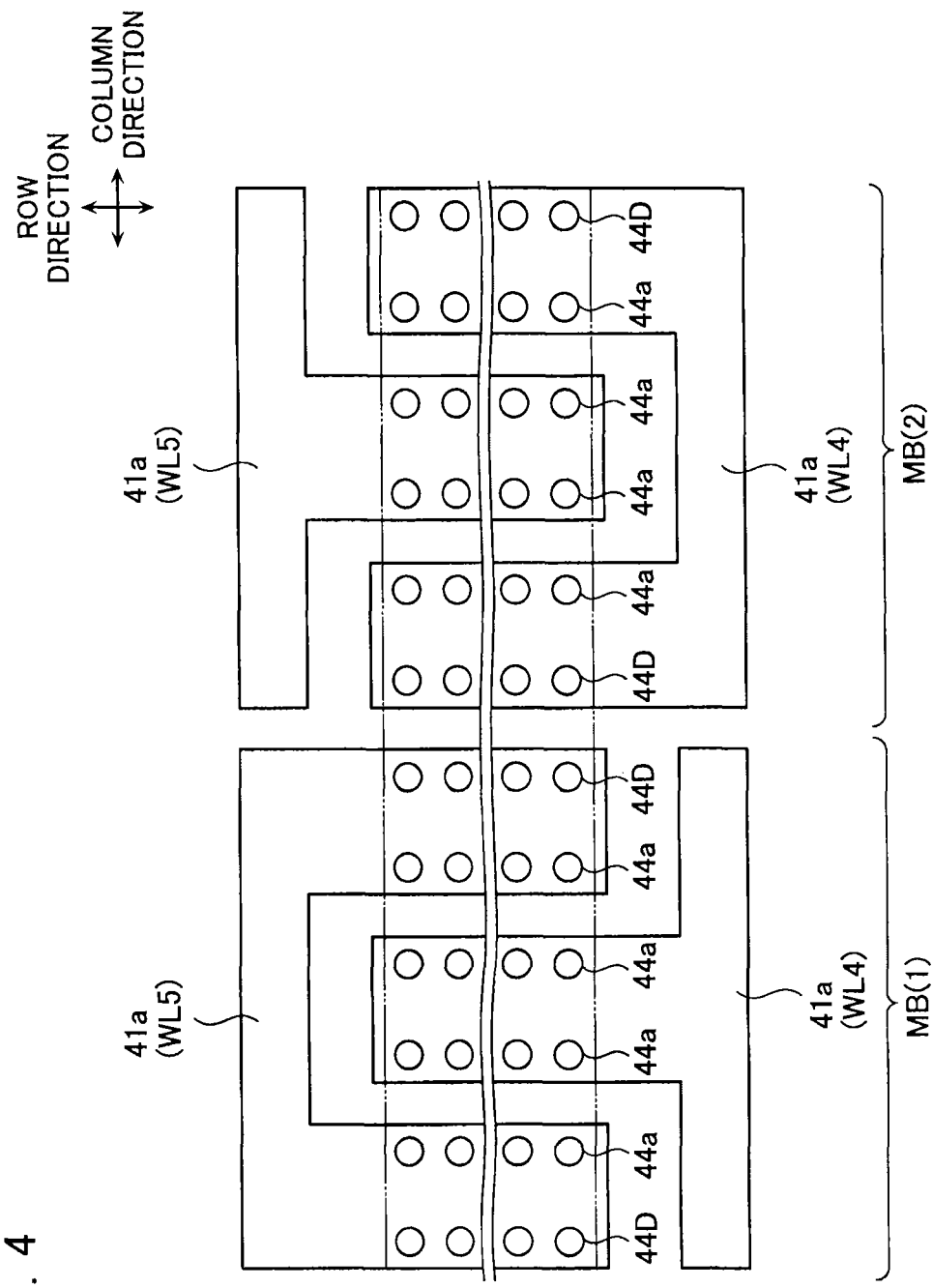

As shown in FIG. 4, the pair of word line conductive layers 41a is provided in one memory block MB. One of the word line conductive layers 41a is formed in a T shape (protruding shape) when seen from the above. The other of the word line conductive layers 41a is formed in a C shape (recessed shape) so as to face the T-shaped word line conductive layer 41a.

Figure 5:
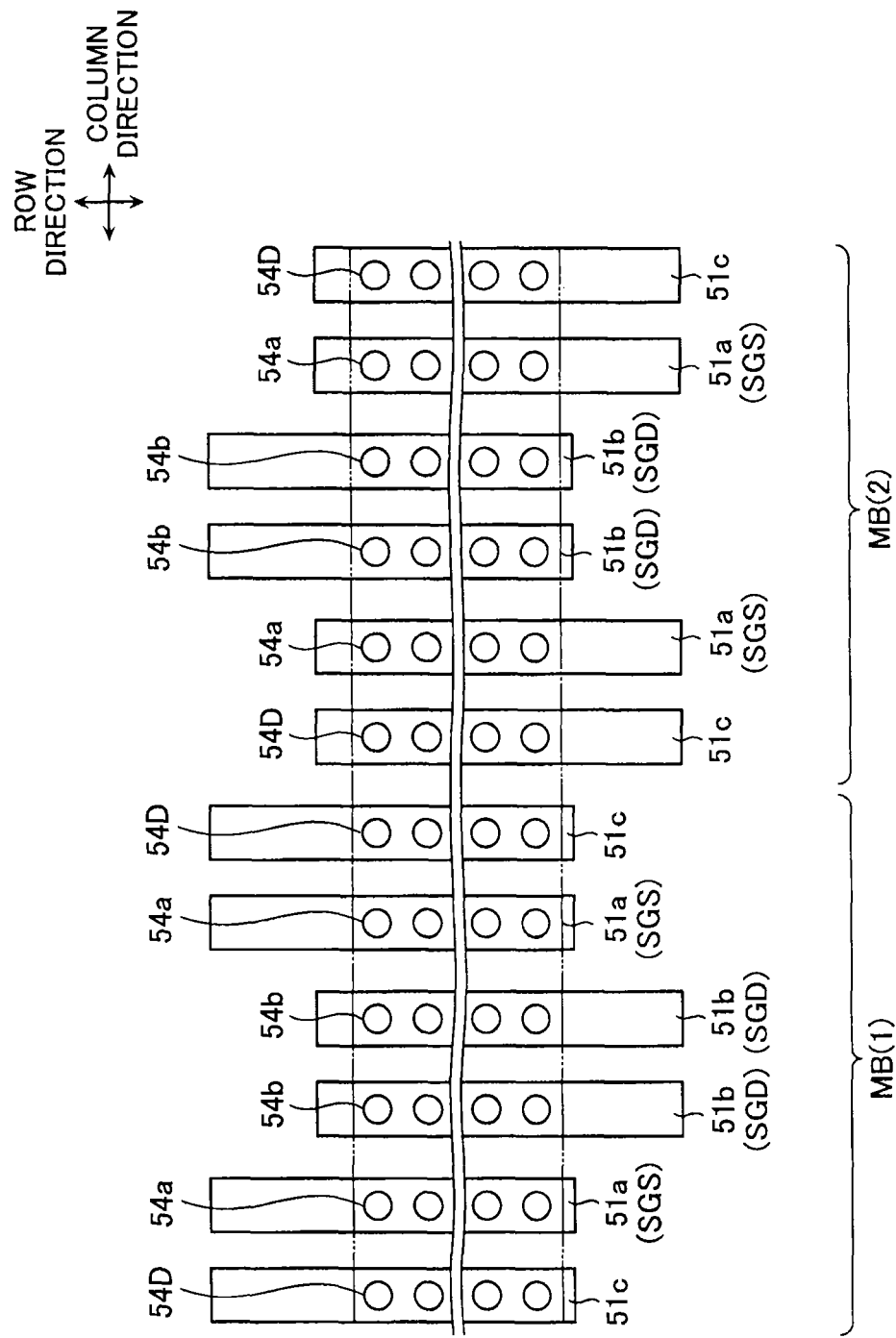
FIG. 5 is a top view illustrating a source side conductive layer 51a, a drain side conductive layer 51b, and a dummy conductive layer 51c.

Subsequently, the shapes of the source side conductive layer 51a, the drain side conductive layer 51b, and the dummy conductive layer 51c will be explained in detail with reference to FIG. 5. As shown in FIG. 5, each of the source side conductive layer 51a, the drain side conductive layer 51b, and the dummy conductive layer 51c is formed to extend in the row direction. As shown in FIG. 1, in the nonvolatile semiconductor memory device in which n by 2 memory strings are arranged in a matrix form in one memory block MB, one memory block MB is provided with a pair of (two) source side conductive layers 51a, a pair of (two) drain side conductive layers 51b, and a pair of (two) dummy conductive layers 51c. The pair of dummy conductive layers 51c is provided at both ends of the memory block MB in the column direction. The pair of source side conductive layers 51a is respectively provided adjacent to the dummy conductive layers 51c. The pair of drain side conductive layers 51b is arranged at a position between the pair of source side conductive layers 51a.

Figure 6:
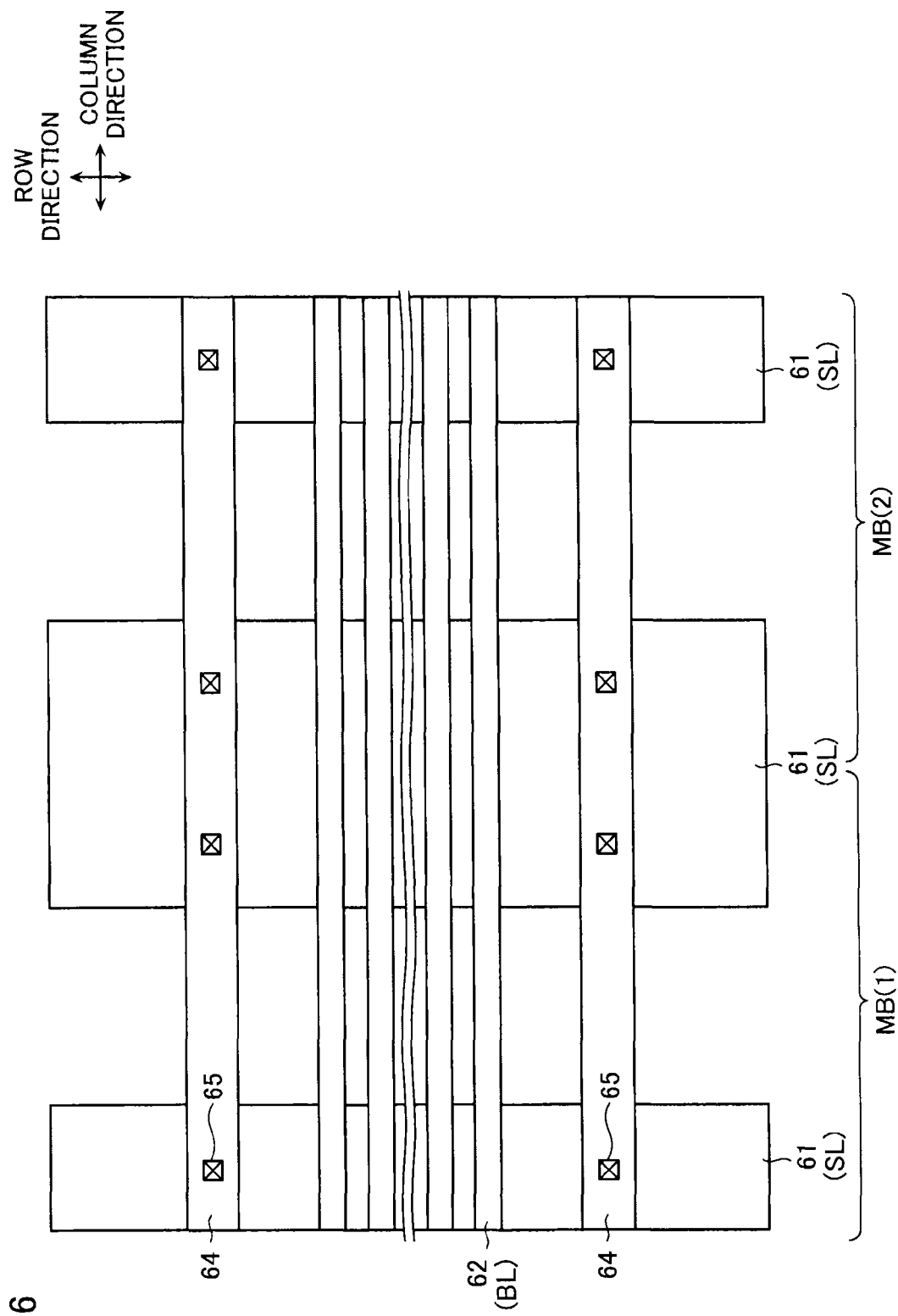
FIG. 6 is a top view illustrating a source line layer 61 and a bit line layer 62.

Subsequently, the shapes of the source line layer 61 and the bit line layer 62 will be explained in detail with reference to FIG. 6. The source line layers 61 are formed to extend in the row direction with a predetermined pitch in the column direction. In an upper layer of the source line layer 61, a common source line layer 64 extending in the column direction is provided. A plurality of source line layers 61 are commonly connected to one common source line layer 64 via the plug layer 65. The bit line layers are formed to extend in the column direction with a predetermined pitch in the row direction.

[Configuration of Peripheral Circuit CC]

Figure 7:
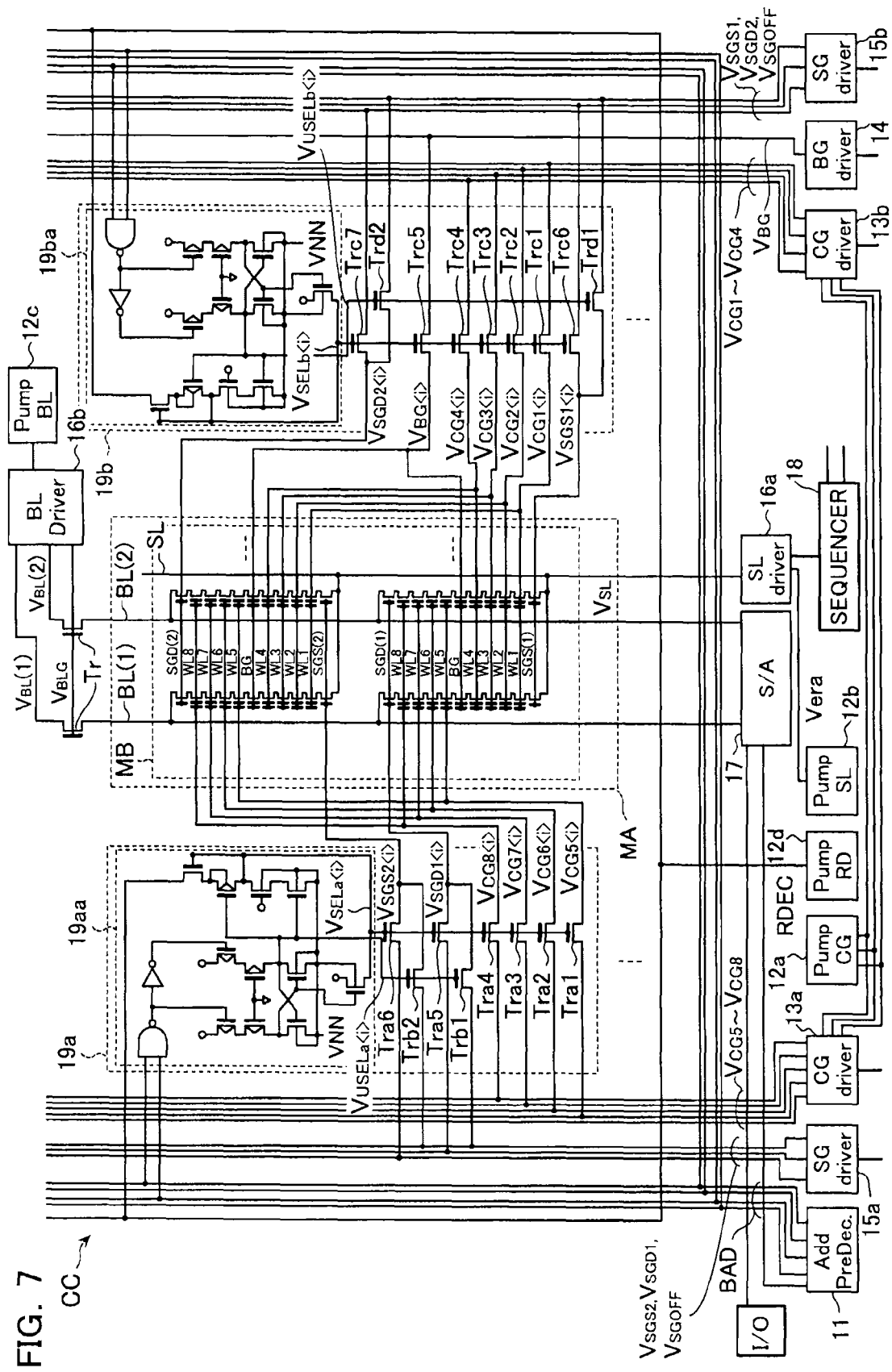
FIG. 7 is a circuit diagram illustrating the peripheral circuit CC according to the first embodiment.

Subsequently, the specific configuration of the peripheral circuit CC according to the above first embodiment will be explained with reference to FIG. 7. As shown in FIG. 7, the peripheral circuit CC includes an address decoder circuit 11, boosting circuits 12a to 12d, word line drive circuits 13a, 13b, a back gate line drive circuit 14, selection gate line drive circuits 15a, 15b, a source line drive circuit 16a, a bit line drive circuit 16b, a sense amplifier circuit 17, a sequencer 18, and row decoder circuits 19a, 19b. The peripheral circuit CC can apply different voltages to respective bit lines BL with the above bit line drive circuit 16b.

The address decoder circuit 11 is connected to row decoders 19a, 19b via a bus. The address decoder circuit 11 outputs a signal BAD to the row decoder circuits 19a, 19b. The signal BAD is a signal for specifying a memory block MB (block address).

The boosting circuits 12a to 12d generate boosted voltage made by boosting a base voltage. The boosting circuit 12a is connected to the word line drive circuits 13a, 13b. The boosting circuit 12a transfers the boosted voltage to the word line drive circuits 13a, 13b. The boosting circuit 12b is connected to the source line drive circuit 16a. The boosting circuit 12b outputs the boosted voltage to the source line drive circuit 16a. The boosting circuit 12c is connected to the bit line drive circuit 16b. The boosting circuit 12c outputs the boosted voltage to the bit line drive circuit 16b. The boosting circuit 12d is connected to the row decoder circuits 19a, 19b. The boosting circuit 12d outputs a boosted signal RDEC to the row decoder circuits 19a, 19b.

The word line drive circuit 13a is connected to the row decoder 19a. The word line drive circuit 13a outputs signals VCG5 to VCG8 to the row decoder 19a. The word line drive circuit 13b is connected to the row decoder 19b. The word line drive circuit 13b outputs signals VCG1 to VCG4 to the row decoder 19b. The signals VCG1 to VCG8 are used to drive the word lines WL1 to WL8 within the selected memory block MB.

The back gate line drive circuit 14 is connected to the row decoder 19b. The back gate line drive circuit 14 outputs a signal VBG to the row decoder 19b. The signal VBG is used to drive the back gate line BG of the selected memory block MB.

The selection gate line drive circuit 15a is connected to the row decoder 19a. The selection gate line drive circuit 15a outputs a signal VSGS2, a signal VSGD1, and a signal VSGOFF to the row decoder 19a. The selection gate line drive circuit 15b is connected to the row decoder 19b. The selection gate line drive circuit 15b outputs a signal VSGS1, a signal VSGD2, and a signal VSGOFF to the row decoder 19b. The signals VSGS1, VSGS2 are used to respectively drive source side selection gate lines SGS(1), SGS(2) within the selected memory block MB. The signals VSGD1, VSGD2 are used to respectively drive the drain side selection gate lines SGD(1), SGD(2) within the selected memory block MB. The signal VSGOFF is used to drive the source side selection gate lines SGS(1), SGS(2) and the drain side selection gate lines SGD(1), SGD(2) within the non-selected memory block MB.

The signal VSGS2, the signal VSGD1, and the signal VSGOFF are input to various kinds of wires from the selection gate line drive circuit 15a via the row decoder circuit 19a. The signals VSGOFF, VSGD2, VSGS1 are input to various kinds of wires from the selection gate line drive circuit 15b via the row decoder circuit 19b.

The source line drive circuit 16a is connected to the source line SL. The source line drive circuit 16a outputs a signal VSL to the source line SL. The signal VSL is used to drive the source line SL. The bit line drive circuit 16b is connected to the bit line BL. The bit line drive circuit 16b selectively supplies a signals VBL(1), VBL(2) to the bit lines BL(1), BL(2) via a transfer transistors Tr. In addition, the bit line drive circuit 16b supplies a signal VBLG to gates of the transfer transistors Tr to control a conductive state of the transfer transistors Tr. The signals VBL(1), VBL(2) are used to drive the bit line BL(1), BL(2). Note that, in FIG. 7, bit lines BL(3) to BL(n) are omitted.

The sense amplifier circuit 17 is connected to the bit line BL. The sense amplifier circuit 17 determines held data in the memory transistors MTr1 to MTr8 on the basis of change of the voltage of the bit line BL. The sequencer 18 is connected to the above circuits 11 to 17. The sequencer 18 supplies a control signal to the circuits 11 to 17, and controls these circuits.

One row decoder circuit 19a, and one row decoder circuit 19b are provided for one memory block MB, respectively. The row decoder 19a is connected to the word lines WL5 to WL8, the source side selection gate line SGS(2), and the drain side selection gate line SGD(1). The row decoder 19b is connected to the word lines WL1 to WL4, the back gate line BG, the drain side selection gate line SGD(2), and the source side selection gate line SGS(1).

The row decoder circuit 19a inputs signals VCG5<i> to VCG8<i> to the gates of the memory transistors MTr5 to MTr8 via the word lines WL5 to 8 on the basis of the signal BAD and the signals VCG5 to VCG8. The row decoder circuit 19a also selectively inputs the signal VSGS2<i> to the gate of the source side selection transistor SSTr located in the second column of the memory block MB via the source side selection gate line SGS(2) on the basis of the signal BAD, the signal VSGS2, and the signal SGOFF. The row decoder circuit 19a also selectively inputs the signal VSGD1<i> to the gate of the drain side selection transistor SDTr located in the first column of the memory block MB via the drain side selection gate line SGD(1) on the basis of the signal BAD, the signal VSGD1, and the signal SGOFF.

The row decoder circuit 19a includes a voltage conversion circuit 19aa, first transfer transistors Tra1 to Tra6, and second transfer transistors Trb1, Trb2. The voltage conversion circuit 19aa is connected to the address decoder circuit 11, the boosting circuit 12d, gates of the first transfer transistors Tra1 to Tra6, and gates of the second transfer transistors Trb1, Trb2. The voltage conversion circuit 19aa generates a signal VSELa<i> on the basis of the signal BAD and the signal RDEC, and outputs the signal VSELa<i> to the gates of the first transfer transistors Tra1 to Tra6. The voltage conversion circuit 19aa generates a signal VUSELa<i> on the basis of the signal BAD, signal RDEC, and outputs the signal VUSELa<i> to the gates of the second transfer transistors Trb1, Trb2.

The first transfer transistors Tra1 to Tra4 are connected between the word line drive circuit 13a and the word lines WL5 to WL8, respectively. The first transfer transistors Tra1 to Tra4 output the signals VCG5<i> to VCG8<i> to the word lines WL5 to WL8, respectively, on the basis of the signals VCG5 to VCG8, VSELa<i>. The first transfer transistor Tra5 is connected between the selection gate line drive circuit 15a and the drain side selection gate line SGD(1). The first transfer transistor Tra6 is connected between the selection gate line drive circuit 15a and the source side selection gate line SGS(2).

The second transfer transistor Trb1 is connected between the selection gate line drive circuit 15a and the drain side selection gate line SGD(1). The second transfer transistor Trb2 is connected between the selection gate line drive circuit 15a and the source side selection gate line SGS(2).

The row decoder circuit 19b inputs the signals VCG1<i> to VCG4<i> to the gates of the memory transistors MTr1 to MTr4 via the word lines WL1 to 4 on the basis of the signal BAD and the signals VCG1 to VCG4. The row decoder circuit 19b inputs a signal VBG<i> to the gate of the back gate transistor BTr via the back gate line BG on the basis of the signal BAD and the signal VBG. The row decoder circuit 19b also selectively inputs the signal VSGS1<i> to the gate of the source side selection transistor SSTr located in the first column of the memory block MB via the source side selection gate line SGS(1) on the basis of the signal BAD, the signal VSGS1, and the signal SGOFF. The row decoder circuit 19b also selectively inputs the signal VSGD2<i> to the gate of the drain side selection transistor SDTr located in the second column of the memory block MB via the drain side selection gate line SGD(2) on the basis of the signal BAD, the signal VSGD2, and the signal SGOFF.

The row decoder circuit 19b includes a voltage conversion circuit 19ba, first transfer transistors Trc1 to Trc7 and second transfer transistors Trd1, Trd2. The voltage conversion circuit 19ba is connected to the address decoder circuit 11, the boosting circuit 12d, gates of the first transfer transistors Trc1 to Trc7, and gates of the second transfer transistors Trd1, Trd2. The voltage conversion circuit 19ba generates a signal VSELb<i> on the basis of the signal BAD and the signal RDEC, and outputs the signal VSELb<i> to the gates of the first transfer transistors Trc1 to Trc7. The voltage conversion circuit 19ba generates a signal VUSELb<i> on the basis of the signal BAD and the signal RDEC, and outputs the signal VUSELb<i> to the gates of the second transfer transistors Trd1, Trd2.

The first transfer transistors Trc1 to Trc4 are connected between the word line drive circuit 13b and the word lines WL1 to WL4, respectively. The first transfer transistors Trc1 to Trc4 output the signals VCG1<i> to VCG4<i> to the word lines WL1 to WL4, respectively, on the basis of the signals VCG1 to VCG4, VSELb<i>. The first transfer transistor Trc5 is connected between the back gate line drive circuit 14 and the back gate line BG. The first transfer transistor Trc5 outputs the signal VBG<i> to the back gate line BG on the basis of the signal VBG and the signal VSELb<i>. The first transfer transistor Trc6 is connected between the selection gate line drive circuit 15b and the source side selection gate line SGS(1). The first transfer transistor Trc7 is connected between the selection gate line drive circuit 15b and the drain side selection gate line SGD(2).

The second transfer transistor Trd1 is connected between the selection gate line drive circuit 15b and the source side selection gate line SGS(1). The second transfer transistor Trd2 is connected between the selection gate line drive circuit 15b and the drain side selection gate line SGD(2).

Erase operation according to the first embodiment is enabled with the configuration of the peripheral circuit CC as shown in FIG. 7 explained above.

[Erase Operation]

Figure 8:
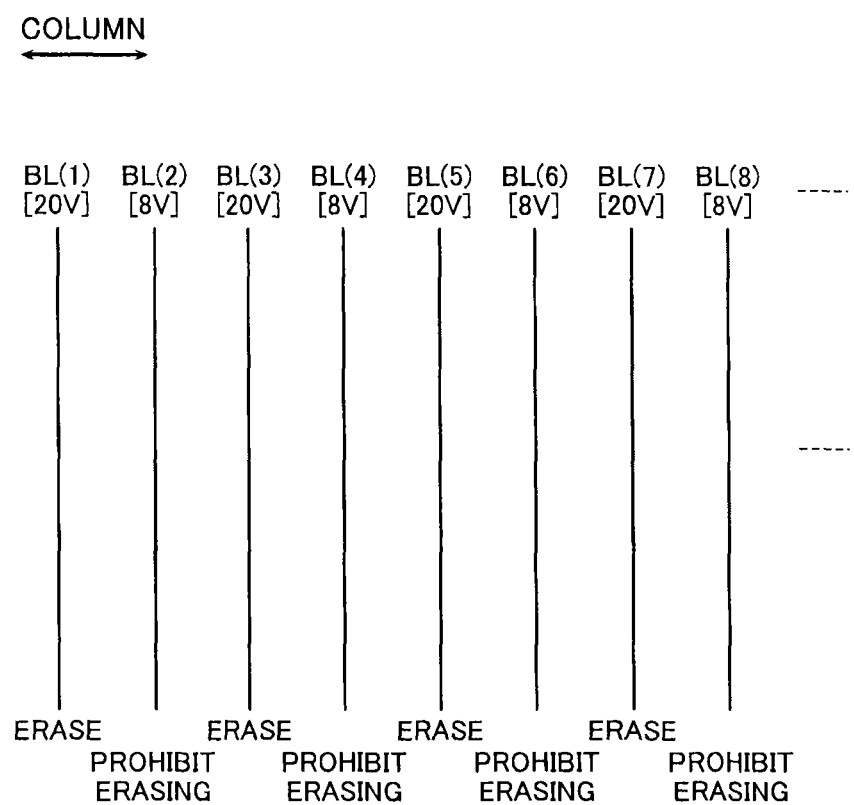
FIG. 8 is a figure illustrating a voltage applied to a bit line BL during an erase operation according to the first embodiment.

Subsequently, erase operation according to the present embodiment will be explained with reference to FIG. 8. According to the erase operation as shown in FIG. 8, it is possible to selectively erase some of the memory transistors MTr included in one selected memory block MB. More specifically, in the selected memory block MB, only the memory units MU connected to the selected bit line BL are adopted as targets of the erase operation. The memory units MU connected to the non-selected bit line BL in the selected memory block MB are not adopted as a target of the erase operation. FIG. 8 illustrates voltages applied to the bit lines BL(1) to BL(8) when this selective erase operation is performed.

Previously, the same voltage is applied to all the bit lines BL, and data in all the memory transistors MTr included in one memory block MB are erased at a time. Therefore, when changing some of the data for performing overwrite of data, it is necessary to write back the data again after collective erase operation. It takes some time to perform this operation.

Figure 9:
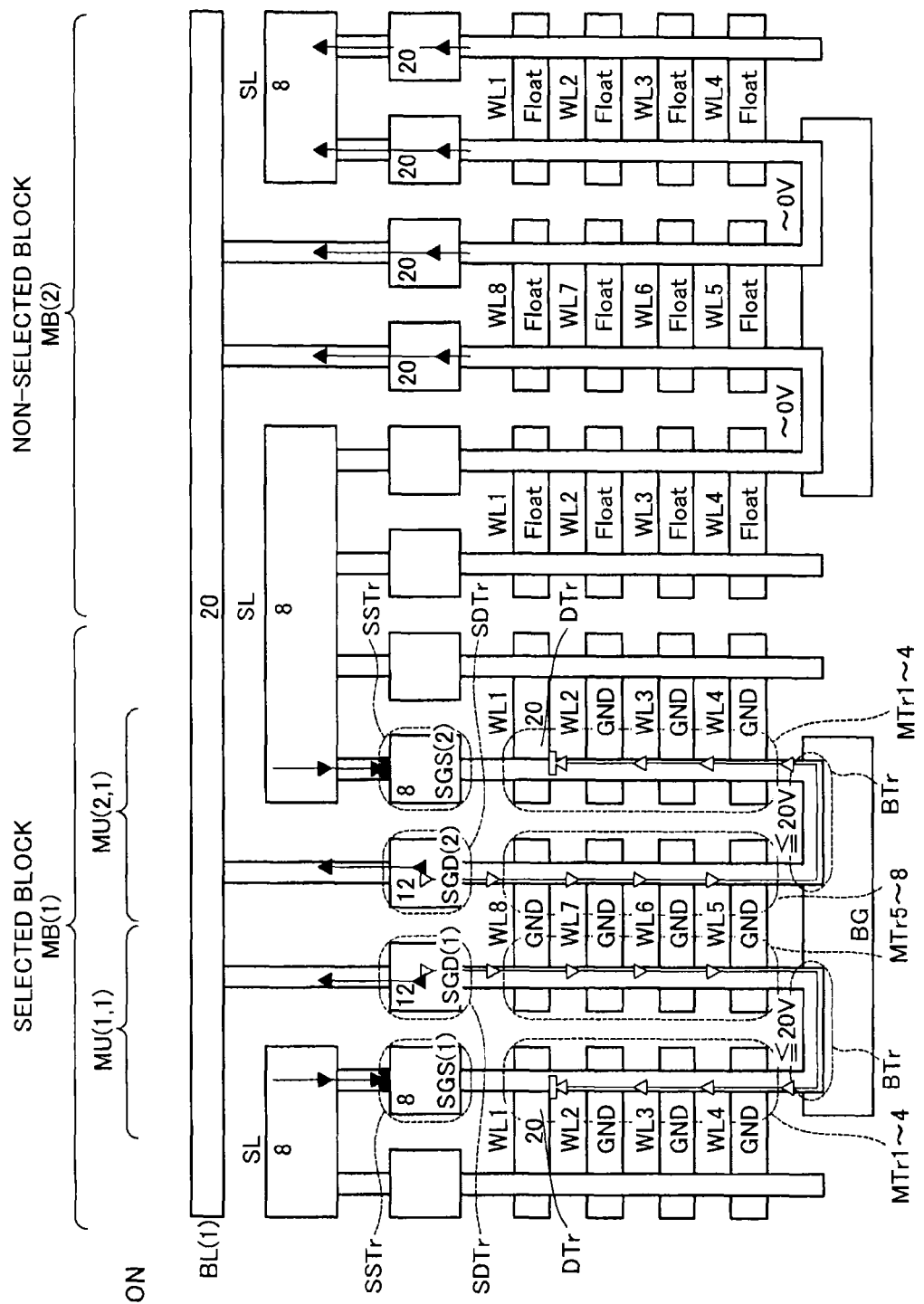
FIG. 9 is a figure illustrating voltages applied to memory units MU(1, 1), MU(2, 1) connected to a selected bit line BL(1) during the erase operation according to the first embodiment.
Figure 10:
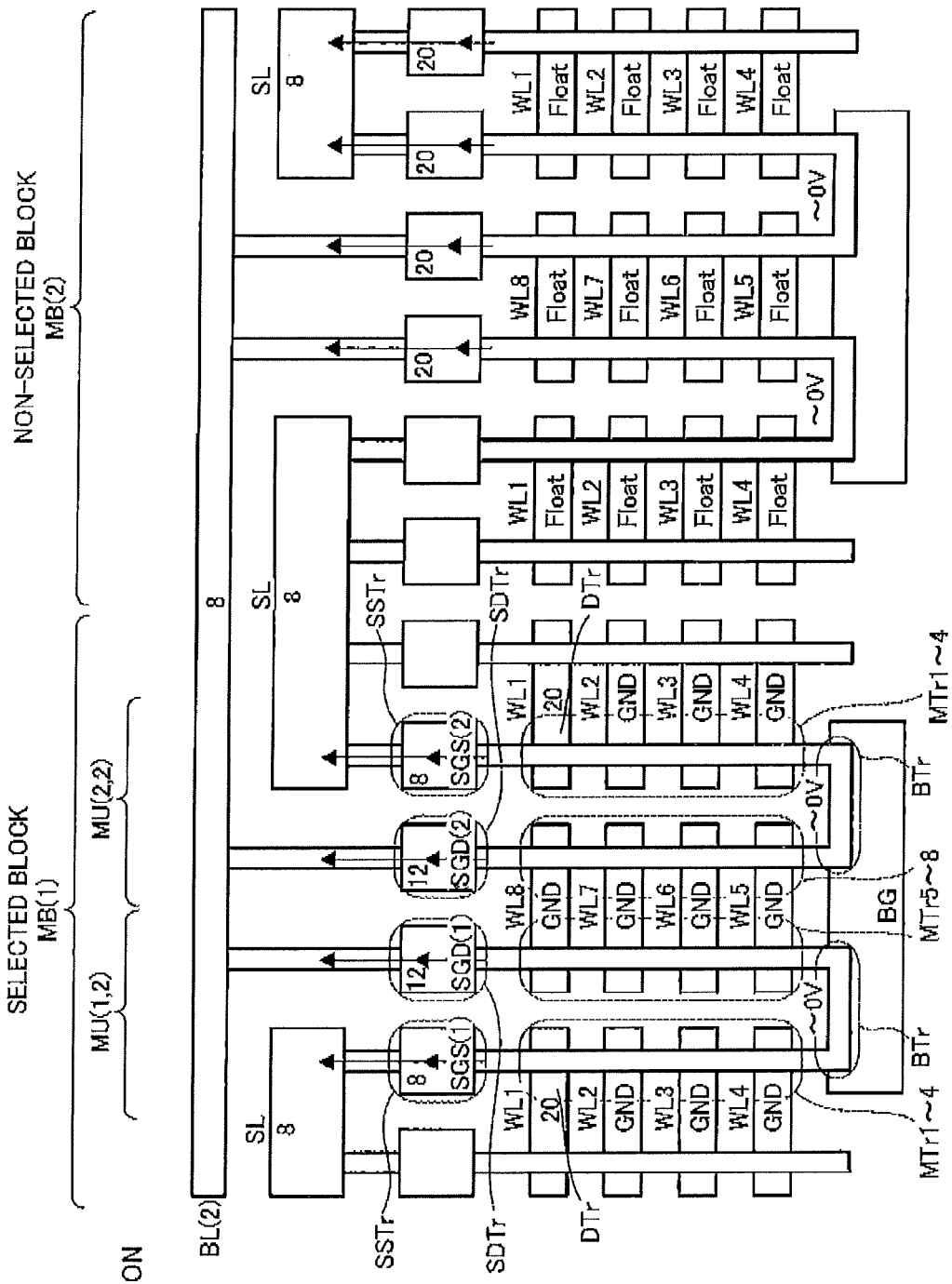
FIG. 10 is a figure illustrating voltages applied to memory units MU(1, 2), MU(2, 2) connected to a non-selected bit line BL(2) during the erase operation according to the first embodiment.

Accordingly, as shown in FIG. 8, in the first embodiment, operation is executed to selectively erase data in particular memory strings MS included in the plurality of memory strings MS in a memory block MB. For this operation, for example, the peripheral circuit CC applies 20 V to the odd-numbered bit lines BL(1), BL(3), BL(5), BL(7) (hereinafter referred to as selected bit lines BL) and applies 8 V to the even-numbered bit lines BL(2), BL(4), BL(6), BL(8) (hereinafter referred to as non-selected bit lines BL). Accordingly, the voltages of the bodies of the memory strings MS (memory transistors MTr1 to MTr8) are set at different voltages according to whether the memory string MS is connected to the selected bit line BL or connected to the non-selected bit line BL. Therefore, as shown in FIGS. 9 and 10 below, With control of the voltages of various kinds of wires, the peripheral circuit CC can selectively execute the erase operation only on the memory units MU connected to the selected bit line BL.

On the other hand, the peripheral circuit CC can prohibit the erase operation to the memory units MU connected to the non-selected bit line BL in the selected memory block MB.

As described above, in order to reduce the size of area of the circuit of the peripheral circuit such as the row decoder, the first embodiment employs a structure in which the plurality of memory strings MS arranged in a matrix form are commonly connected to one word line WL. For example, a comparative example will be considered where a plurality of memory strings MS (memory blocks) sharing a word line WL are adopted as the minimum unit for erasing data. In this comparative example, as the number of stacked word lines WL increases, the size of one memory block increases, and as a result, the minimum unit of data erase operation also increases. In the comparative example, when the minimum unit of data erase operation is reduced, the memory capacity of data substantially decreases. In contrast, the first embodiment is configured to selectively erase only some of the memory cells in one memory block. Accordingly, in the first embodiment, even if the number of stacked word lines WL increases, the unit of data erase operation does not increase. In the first embodiment, the data memory capacity does not decrease according to the erase operation.

Subsequently, with reference to FIGS. 9 and 10, voltages applied to various kinds of wires within the selected memory block MB(1) when the above selective erase operation is executed will be explained. In FIGS. 9 and 10, the memory transistor MTr1 is used as the dummy transistor DTr that is not used for store data. FIG. 9 illustrates voltages applied to memory units MU(1, 1), MU(2, 1) connected to the selected bit line BL(1) during erase operation in the selected memory block MB(1). FIG. 10 illustrates voltages applied to memory units MU(1, 2), MU(2, 2) connected to the non-selected bit line BL(2) during erase operation in the selected memory block MB(1).

First, the memory units MU(1, 1), MU(2, 1) within the selected memory block MB(1) connected to the selected bit line BL(1) will be explained with reference to FIG. 9. As shown in FIG. 9, 20 V is applied to the selected bit line BL(1), and on the other hand, 8 V is applied to the source line SL.

As shown in FIG. 9, 8 V is applied to the source side selection gate lines SGS(1), SGS(2). On the other hand, 12 V is applied to the drain side selection gate lines SGD(1), SGD(2). Accordingly, in the memory units MU(1, 1), MU(2, 1), a GIDL current is generated in proximity to the gate of the drain side selection transistor SDTr. Therefore, the charges generated by the GIDL current flows into the selected bit line BL(1), and on the other hand, the holes flow into the body of the memory string MS (memory transistors MTr2 to MTr8).

On the other hand, in the memory units MU(1, 1), MU(2, 1), generation of the GIDL current is prohibited in proximity to the gate of the source side selection transistor SSTr. In the memory units MU(1, 1), MU(2, 1), a voltage of 8 V is applied to the source line SL, and the same voltage, i.e., 8 V is also applied to the source side selection gate lines SGS(1), SGS(2). Accordingly, the source side selection transistor STr prohibits a movement of charges from the source line SL to the memory string MS.

As shown in FIG. 9, 20 V is applied to the word line WL1. On the other hand, a ground voltage GND is applied to the word lines WL2 to WL8 and the back gate line BG. Since 20 V is applied to the word line. WL1, in the memory units MU(1, 1), MU(2, 1), the holes generated in the drain side selection transistor SDTr pass through the memory transistors MTr2 to 8 but do not pass through the dummy transistor DTr (memory transistor MTr1). Therefore, the voltages of the bodies of the memory transistors MTr2 to MTr8 can be increased to a voltage close to 20 V.

With a thus controlled potential difference between the bodies and the gates of the memory transistors MTr2 to MTr8, the erase operation is executed on the memory transistors MTr2 to MTr8 in the memory units MU(1, 1), MU(2, 1) connected to the selected bit line BL(1).

Subsequently, the memory units MU(1, 2), MU(2, 2) within the selected memory block MB(1) connected to the non-selected bit line BL(2) will be explained with reference to FIG. 10. As shown in FIG. 10, 8 V is applied to the non-selected bit line BL(2), and the same voltages as those of FIG. 9 are applied to the other wires.

Accordingly, as shown in FIG. 10, in the memory units MU(1, 2), MU(2, 2), generation of the GIDL current is prohibited in proximity to the gate of the source side selection transistor SSTr and in proximity to the gate of the drain side selection transistor SDTr. Accordingly, in the memory units MU(1, 2), MU(2, 2), the voltages of the bodies of the memory transistors MTr2 to MTr8 do not increase.

As a result, in the memory units MU(1, 2), MU(2, 2) connected to the non-selected bit line BL(2), erase operation for the memory transistors MTr2 to MTr8 is prohibited.

In the non-selected memory block MB(2), as shown in FIGS. 9 and 10, the word lines WL1 to WL8 are in floating state. Accordingly, in the non-selected memory block MB(2), erase operation for the memory transistors MTr2 to MTr8 is prohibited.

Second Embodiment

Configuration

Subsequently, a nonvolatile semiconductor memory device according to a second embodiment will be explained. The second embodiment has the same configuration as the first embodiment. Therefore, description thereabout is not repeated here. In the second embodiment, erase operation explained below is different from that of the first embodiment.

[Erase Operation]

Erase operation of the nonvolatile semiconductor memory device according to the second embodiment will be explained. In the second embodiment, the voltages applied to the bit lines BL in the erase operation are the same as those of the first embodiment. In other words, the peripheral circuit CC selectively executes the erase operation on the memory units MU connected to the selected bit line BL, and on the other hand, the peripheral circuit CC prohibits the erase operation on the memory units MU connected to the non-selected bit line BL.

Figure 11:
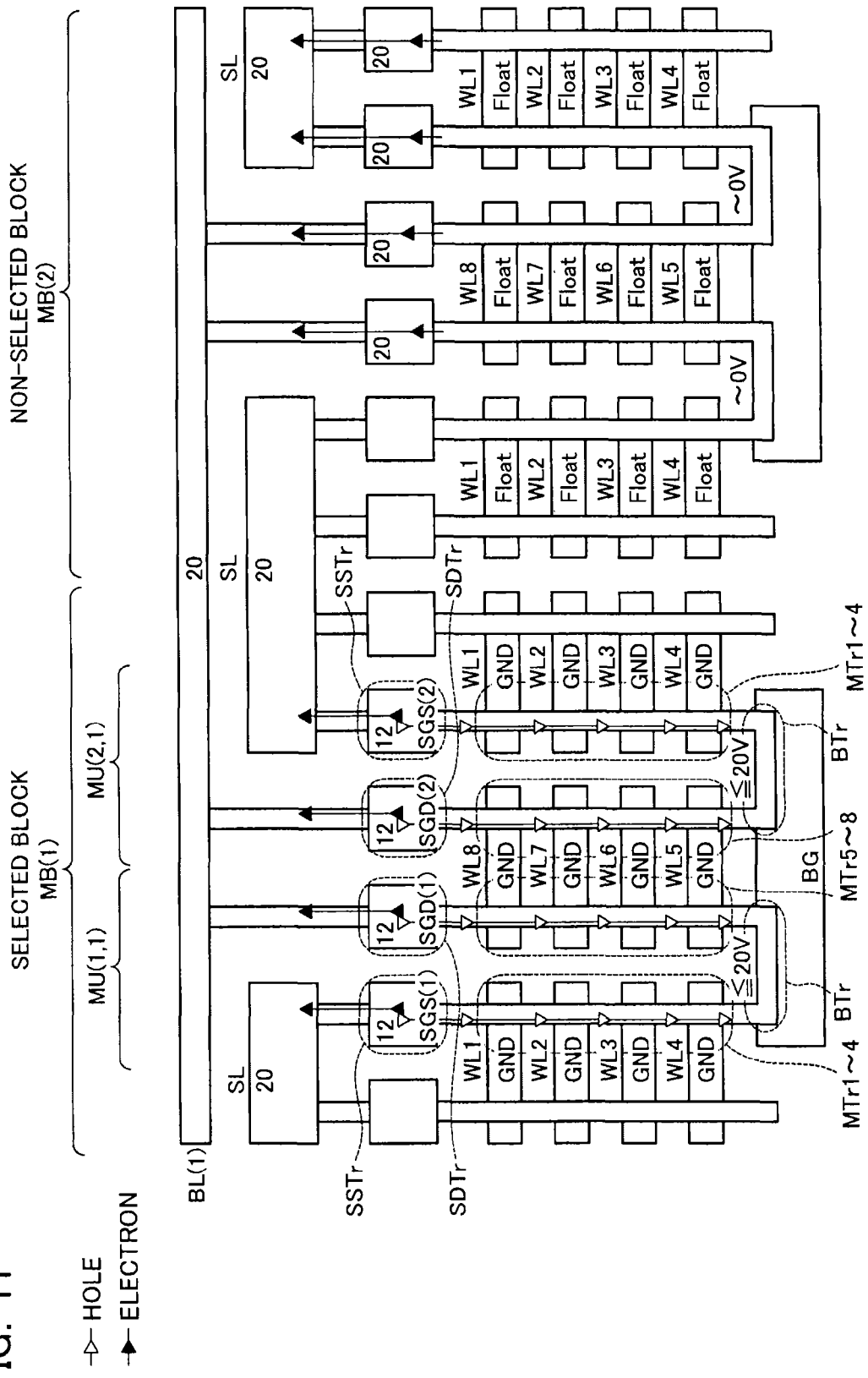
FIG. 11 is a figure illustrating voltages applied to the memory units MU(1, 1), MU(2, 1) connected to the selected bit line BL(1) during the erase operation according to a second embodiment.
Figure 12:
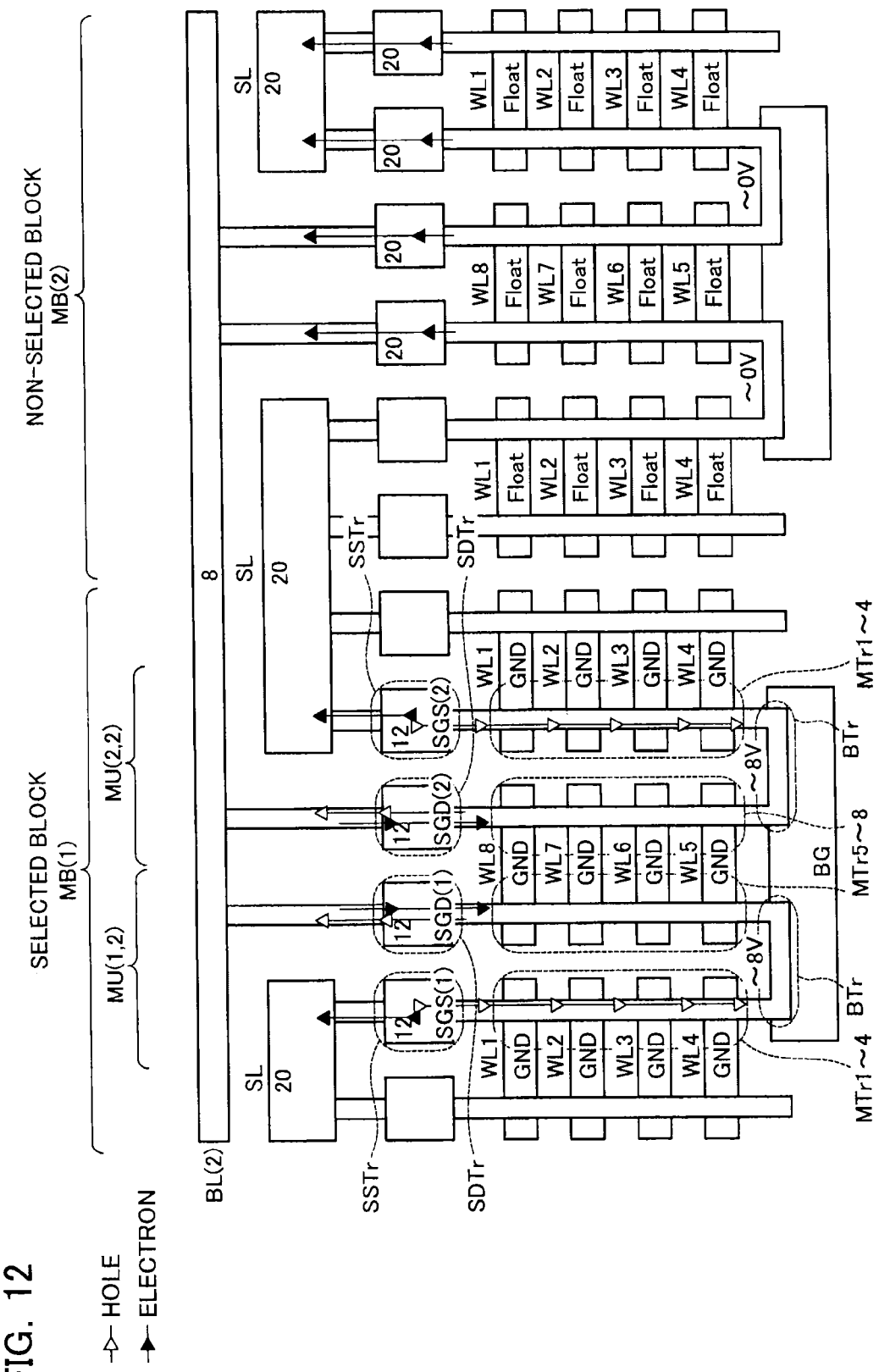
FIG. 12 is a figure illustrating voltages applied to the memory units MU(1, 2), MU(2, 2) connected to the non-selected bit line BL(2) during the erase operation according to the second embodiment.

In the second embodiment, the memory transistor MTr1 is not used as the dummy transistor DTr, and is used to store data. Therefore, the voltages applied to various kinds of wires except the bit line BL in the erase operation are different from those of the first embodiment. Hereinafter, with reference to FIGS. 11 and 12, voltages applied to various kinds of wires within the selected memory block MB(1) when the above selective erase operation is executed will be explained. FIG. 11 illustrates voltages applied to memory units MU(1, 1), MU(2, 1) connected to the selected bit line BL(1) during erase operation in the selected memory block MB(1). FIG. 12 illustrates voltages applied to memory units MU(1, 2), MU(2, 2) connected to the non-selected bit line BL(2) during erase operation in the selected memory block MB(1).

First, the memory units MU(1, 1), MU(2, 1) within the selected memory block MB(1) connected to the selected bit line BL(1) will be explained with reference to FIG. 11. As shown in FIG. 11, 20 V is applied to the selected bit line BL(1), and 20 V is also applied to the source line SL.

As shown in FIG. 11, 12 V is applied to the source side selection gate lines SGS(1), SGS(2) and the drain side selection gate lines SGD(1), SGD(2). Accordingly, in the memory units MU(1, 1), MU(2, 1), a GIDL current is generated in proximity to the gate of the drain side selection transistor SDTr and in proximity to the gate of the source side selection transistor SSTr. Therefore, the charges generated by the GIDL current flows into the selected bit line BL(1) and the source line SL, and on the other hand, the holes move toward the body of the memory string MS (memory transistors MTr1 to MTr8).

As shown in FIG. 11, the ground voltage GND is applied to the word lines WL1 to WL8 and the back gate line BG. Accordingly, the bodies of the memory transistors MTr1 to MTr8 are filled with the holes generated in the drain side selection transistor SDTr and the source side selection transistor SSTr. Therefore, the voltages of the bodies of the memory transistors MTr1 to MTr8 increase to a voltage close to 20 V.

With a thus controlled potential difference between the bodies and the gates of the memory transistors MTr1 to MTr8, erase operation is executed on the memory transistors MTr1 to MTr8 in the memory units MU(1, 1), MU(2, 1) connected to the selected bit line BL(1).

As described above, in the second embodiment, GIDL currents are generated in proximity to the source side selection transistor SSTr and the drain side selection transistor SDTr. In other words, in the first embodiment, the GIDL current is generated at one end side of the memory string MS, but in the second embodiment, the GIDL currents are generated at both ends of the memory string MS. Therefore, the erase time of the second embodiment is less than the erase time of the first embodiment. In the second embodiment, data can be erased more uniformly and reliably as compared with the first embodiment.

Subsequently, the memory units MU(1, 2), MU(2, 2) within the selected memory block MB(1) connected to the non-selected bit line BL(2) will be explained with reference to FIG. 12. As shown in FIG. 12, 8 V is applied to the non-selected bit line BL(2), and the same voltages as those of FIG. 11 are applied to the other wires.

Accordingly, as shown in FIG. 12, in the memory units MU(1, 2), MU(2, 2), a GIDL current is generated in proximity to the gate of the source side selection transistor SSTr. Therefore, the electrons generated by the GIDL current flows into the source line SL, and on the other hand, and the holes flow into the body of the memory string MS (memory transistors MTr1 to MTr8). On the other hand, in the memory units MU(1, 2), MU(2, 2), the holes generated in the source side selection transistor SSTr flow into the non-selected bit line BL(2) via the drain side selection transistor SDTr. Accordingly, in the memory units MU(1, 2), MU(2, 2), the voltages of the bodies of the memory transistors MTr1 to MTr8 do not increase.

As a result, in the memory units MU(1, 2), MU(2, 2) connected to the non-selected bit line BL(2), erase operation for the memory transistors MTr1 to MTr8 is prohibited.

In the non-selected memory block MB(2), as shown in FIGS. 11 and 12, the word lines WL1 to WL8 are in floating state. Accordingly, in the non-selected memory block MB(2), erase operation for the memory transistors MTr1 to MTr8 is prohibited.

Third Embodiment

Configuration

Subsequently, a nonvolatile semiconductor memory device according to a third embodiment will be explained. The third embodiment has the same configuration as the first embodiment. Therefore, description thereabout is not repeated here. In the third embodiment, erase operation explained below is different from that of the first embodiment.

[Erase Operation]

Erase operation of the nonvolatile semiconductor memory device according to the third embodiment will be explained with reference to FIG. 13. In the third embodiment, the voltages applied to the bit lines BL in the erase operation are different from those of the first and second embodiments. The third embodiment has the same configuration as the first embodiment. Therefore, description thereabout is not repeated here.

Figure 13:
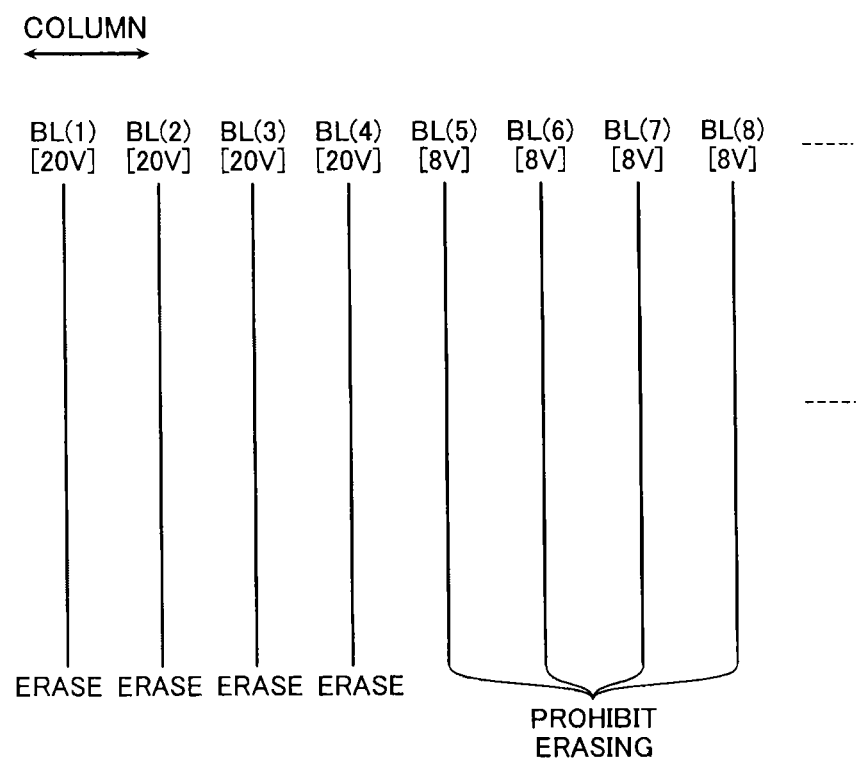
FIG. 13 is a figure illustrating a voltage applied to the bit line BL during the erase operation according to a third embodiment.

As shown in FIG. 13, in the third embodiment, during the erase operation, 20 V and 8 V are applied to every four bit lines BL arranged adjacent to each other in the column direction. Accordingly, the peripheral circuit CC selectively executes the erase operation on the memory units MU connected to the selected bit lines BL(1) to BL(4), and on the other hand, the peripheral circuit CC prohibits the erase operation on the memory units MU connected to the non-selected bit line BL(5) to BL(8).

As described above, in the third embodiment, 20 V and 8 V are applied to every four bit lines BL. Therefore, as compared with the first embodiment in which 20 V and 8 V are alternately applied to the bit lines BL, joining between the bit lines BL can be reduced in the third embodiment.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 14:
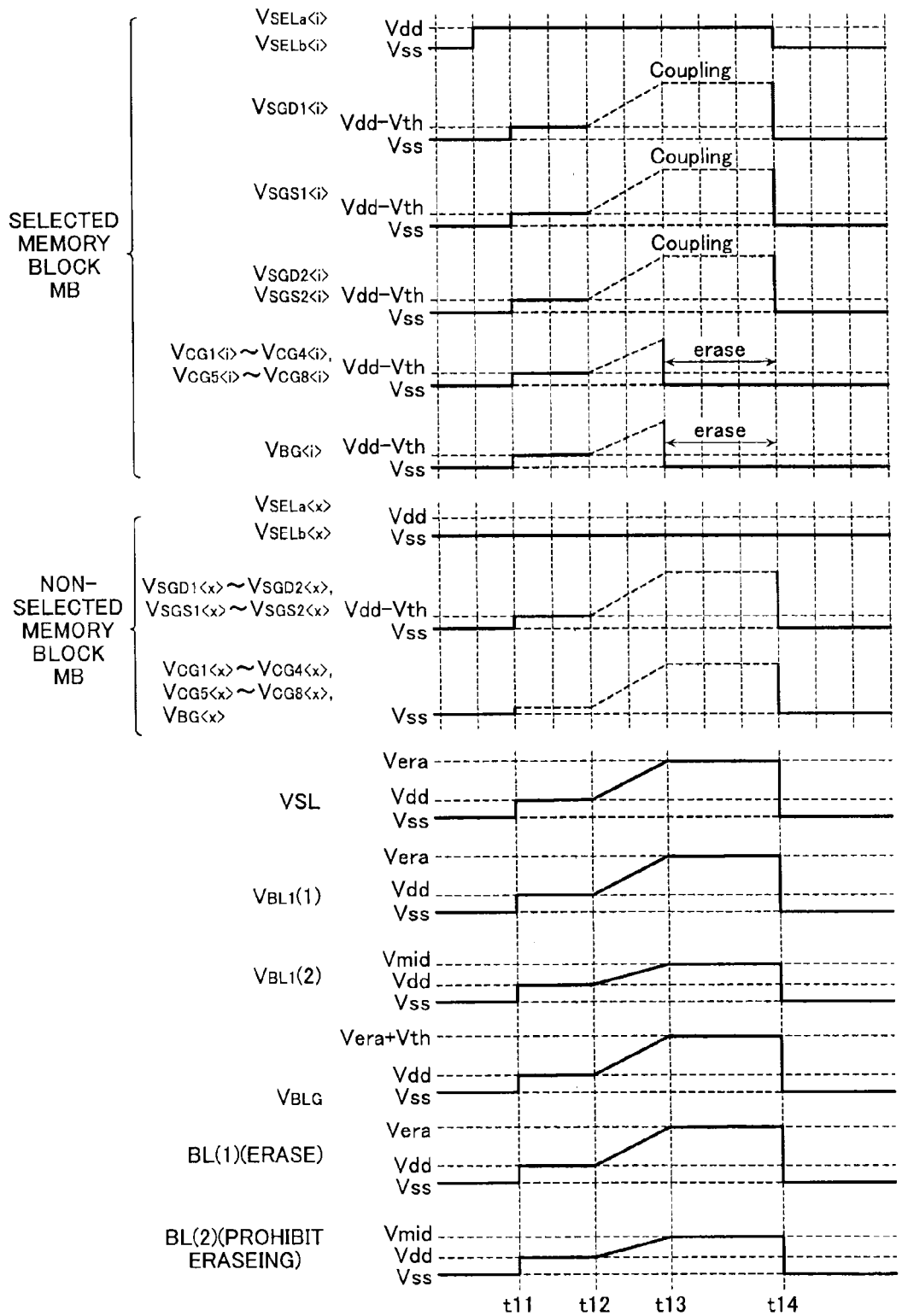
FIG. 14 is a timing chart showing the erase operation due to the control circuit CC shown in FIG. 7

For example, in the erase operation, voltages of the bit lines BL(1) and BL(2) may be controlled as shown in FIG. 14. FIG. 14 is a timing chart showing the erase operation due to the control circuit CC shown in FIG. 7. As shown in FIG. 14, at time t11, the control circuit CC raises voltages of the signals VBL(1), VBL(2), and VBLG to a power supply voltage Vdd. This causes the power supply voltage Vdd to be transferred to the bit lines BL(1) and BL(2). Additionally at time t11, in the selected memory block MB, the control circuit CC raises voltages of the word lines WL1 to WL8 (signals VCG1$<i>$ to VCG8$<i>$), a voltage of the back gate line BG (signal VBG$<i>$), a voltage of the drain side select gate line SGD (signals VSGD1$<i>$ and VSGD2$<i>$), and a voltage of the source side select gate line SGS (signals VSGS1$<i>$ and VSGS2$<i>$) to a voltage Vdd-Vth.

Next, from time t12 through time t13, the control circuit CC raises the signal VBL(1) to an erase voltage Vera (20 V), raises the signal VBL(2) to an intermediate voltage Vmid (8 V), and raises the signal VBLG to a voltage Vera+Vth. This causes the erase voltage Vera to be transferred to the bit line BL(1), and the intermediate voltage Vmid to be transferred to the bit line BL(2). Additionally from time t12 through time t13, the control circuit CC raises the voltage of the drain side select gate line SGD (signals VSGD1$<i>$ and VSGD2$<i>$) with a certain potential difference with the voltage of the bit line BL, whereby a voltage of a body of the drain side select transistor SDTr is raised. Additionally from time t12 through time t13, the control circuit CC raises the voltage of the source side select gate line SGS (signals VSGS1$<i>$ and VSGS2$<i>$) with a certain potential difference with the voltage VSL of the source line SL, whereby a voltage of a body of the source side select transistor SSTr is raised.

Next, from time t13 through time t14, the control circuit CC sets the voltages of the word lines WL1 to WL8 (signals VCG1$<i>$ to VCG8$<i>$) and the voltage of the back gate line BG (signal VBG$<i>$) to a ground voltage Vss. This results in the erase operation being executed on the memory transistor MTr from time t13 through time t14.

What is claimed is:

1. A nonvolatile semiconductor memory device comprising:

a semiconductor substrate;

a plurality of memory strings including a plurality of memory transistors connected in series and stacked above the semiconductor substrate;

a plurality of bit lines respectively connected to one ends of the memory strings, the bit lines including a first bit line, a second bit line, a third bit line, and a fourth bit line, the second bit line being adjacent to the first and third bit lines, the third bit line being adjacent to the second and fourth bit lines;

the first bit line, the second bit line, the third bit line, and the fourth bit line being provided in this order; and a control circuit configured to perform an erase operation for the memory transistors electrically connected to the first bit line and the memory transistors electrically connected to the third bit line on the condition that a first voltage is applied to the first bit line and the third bit line, and a second voltage is applied to the second bit line and the fourth bit line, the first voltage being higher than the second voltage, wherein during the erase operation, the control circuit is configured to apply the second voltage to a source line, apply the second voltage to gates of source side selection transistors, each of the source side selection transistors being electrically connected between the memory strings and the source line.

2. The nonvolatile semiconductor memory device according to claim 1, wherein during the erase operation, the control circuit is configured to apply a third voltage to gates of first drain side selection transistors, each of the first drain side selection transistors being electrically connected between the memory strings and the first bit line, the second bit line, the third bit line or the fourth bit line, the third voltage being higher than the second voltage and lower than the first voltage.

3. The nonvolatile semiconductor memory device according to claim 1, further comprising:

a plurality of word lines electrically connected to the plurality of memory transistors, wherein during the erase operation, the control circuit is configured to apply a fourth voltage to one of the plurality of word lines, and apply a ground voltage to other of the plurality of word lines, the fourth voltage being higher than the ground voltage.

4. The nonvolatile semiconductor memory device according to claim 3, wherein:

the memory transistor electrically connected to the one of the plurality of word lines is directly connected to source side selection transistor, and the fourth voltage is the same as the first voltage.

5. The nonvolatile semiconductor memory device according to claim 1, wherein the plurality of bit lines includes a fifth bit line adjacent to the first bit line, and a sixth bit line adjacent to the fourth bit line; and the control circuit is configured to also perform the erase operation for the memory transistors electrically connected to the fifth bit line, and apply the first voltage to the fifth bit line and apply the second voltage to the sixth bit line during the erase operation.

6. A nonvolatile semiconductor memory device comprising:

a semiconductor substrate;

a plurality of memory strings including a plurality of memory transistors connected in series and stacked above the semiconductor substrate;

a plurality of bit lines respectively connected to one ends of the memory strings, the bit lines including a first bit line, a second bit line, a third bit line, and a fourth bit line, the second bit line being adjacent to the first and third bit lines, the third bit line being adjacent to the second and fourth bit lines;

the first bit line, the second bit line, the third bit line, and the fourth bit line being provided in this order; and a control circuit configured to perform an erase operation for erasing the memory transistors electrically connected to the first bit line or the third bit line without erasing the memory transistors electrically connected to the second bit line or the fourth bit line.

7. The nonvolatile semiconductor memory device according to claim 6, wherein the plurality of bit lines includes a fifth bit line adjacent to the first bit line, and a sixth bit line adjacent to the fourth bit line; and the control circuit is configured to also perform the erase operation for erasing the memory transistors electrically connected to the fifth bit line without erasing the memory transistors electrically connected to the sixth bit line.

8. The nonvolatile semiconductor memory device according to claim 6, wherein during the erase operation, the control circuit is configured to apply a first voltage to the first and second bit lines, and a second voltage to the third and fourth bit lines, apply the second voltage to a source line, and apply the second voltage to gates of source side selection transistors, each of the source side selection transistors being electrically connected between the memory strings and the source line.

* * * * *